United States Patent [19]

Fujisawa

[11] 4,382,251

[45] May 3, 1983

[54] ENVELOPE CONTROL DEVICE FOR PIEZOELECTRIC BUZZER

[75] Inventor: Hidetaka Fujisawa, Fussa, Japan

[73] Assignee: Casio Computer Co., Ltd., Tokyo, Japan

[21] Appl. No.: 189,759

[22] Filed: Sep. 23, 1980

[51] Int. Cl.³ .......................... G08B 3/00; H01L 41/10

[52] U.S. Cl. .................................. 340/384 E; 84/1.04; 84/1.14; 84/DIG. 24; 310/317; 340/384 R

[58] Field of Search ........................ 340/384 E, 384 R; 368/72, 73, 75, 250, 251, 255, 268, 272, 273; 84/1.01, 1.04, 1.06, 1.14, 1.26, DIG. 24; 310/316, 317

[56] References Cited

U.S. PATENT DOCUMENTS

| | | | |
|---|---|---|---|
| 3,746,897 | 7/1973 | Karatjas | 310/316 |
| 3,890,612 | 6/1975 | Sweany et al. | 340/384 E |
| 3,922,672 | 11/1975 | Birt et al. | 340/384 R X |
| 4,068,461 | 1/1978 | Fassett et al. | 368/255 X |
| 4,104,628 | 8/1978 | Sweany et al. | 340/384 E |
| 4,166,358 | 9/1979 | Tremblay et al. | 340/384 E X |
| 4,205,517 | 6/1980 | Murakami et al. | 368/72 X |
| 4,267,586 | 5/1981 | Uchino et al. | 368/272 X |
| 4,267,589 | 5/1981 | Yamaguchi | 340/384 E X |

FOREIGN PATENT DOCUMENTS

| | | |
|---|---|---|
| 2247155 | 12/1974 | Fed. Rep. of Germany . |
| 2850286 | 6/1980 | Fed. Rep. of Germany . |
| 2838288 | 8/1980 | Fed. Rep. of Germany . |
| 1245565 | 9/1971 | United Kingdom . |
| 1559371 | 1/1975 | United Kingdom . |
| 1464997 | 2/1977 | United Kingdom . |
| 1488896 | 10/1977 | United Kingdom . |
| 2031636 | 4/1980 | United Kingdom . |
| 2035624 | 6/1980 | United Kingdom . |

*Primary Examiner*—Marshall M. Curtis
*Assistant Examiner*—Daniel Myer
*Attorney, Agent, or Firm*—Frishauf, Holtz, Goodman and Woodward

[57] ABSTRACT

An envelope control device for the piezoelectric buzzer of the invention applies voltages changing with time to both surfaces of a sound generator for push-pull operation for generating an electric tone. The sound generator comprises an oscillating plate with a piezoelectric element attached thereto, and in response to a tone signal outputted from a tone signal generating circuit, it generates an electric tone. By the push-pull operations, an envelope is applied to the electric tone generated.

6 Claims, 7 Drawing Figures

| RESISTOR | RESISTANCE VALUE |
|---|---|
| $R_1, R_2, R_3$ | $0.9\ R_0$ |
| $R_2, R_3$ | $1.2\ R_0$ |
| $R_1, R_3$ | $1.3\ R_0$ |
| $R_1, R_2$ | $1.7\ R_0$ |
| $R_3$ | $2\ R_0$ |
| $R_2$ | $3\ R_0$ |
| $R_1$ | $4\ R_0$ |

ENVELOPE CONTROL DEVICE FOR PIEZOELECTRIC BUZZER

BACKGROUND OF THE INVENTION

The present invention relates to an envelope control device for a piezoelectric buzzer wherein levels of voltages applied to the piezoelectric buzzer are changed with time for effective envelope control.

Among the compact electronic devices such as electronic watches and small electronic calculators, some have been conventionally developed which have, in addition to their original functions, other functions such as an alarm function for outputting an alarm sound or a function of outputting a tone. The alarm function is utilized for signalling the time by buzzing at a predetermined set time. The tone outputting function is utilized for confirmation of operated keys or as a simplified musical instrument by generating a musical tone of "C" when the key "1" among the ten keys is operated, a musical tone of "D" when the key "2" is operated, a tone of "E" when the key "3" is operated and so on. However, a piezoelectric buzzer can only provide extremely monotonous sounds of the same volume and has thus been defective in that it cannot provide aftersounds as in natural musical instruments.

It is an object of the present invention to provide an envelope control device for a piezoelectric buzzer wherein a plurality of different voltage levels are obtained to be selectively applied to both surfaces or electrodes of the piezoelectric buzzer for performing envelope control and providing output sounds similar to the natural sounds.

It is another object of the present invention to provide an envelope control device for a piezoelectric buzzer wherein the resistances of resistor components interposed between the piezoelectric buzzer and the voltage source are charged with time for performing envelope control and outputting natural-like output sounds.

SUMMARY OF INVENTION

To the above and other ends, the present invention provides an envelope control device for a piezoelectric buzzer comprising:

a sound generator comprising an oscillating plate with a piezoelectric element attached thereto;

a power source for supplying voltages to be applied to both surfaces of said sound generator;

tone signal generating means for generating a tone signal for generating an electric tone; and envelope control means for changing with time voltages to be applied to said both surfaces of said sound generator for supplying said changing voltages to said sound generator for push-pull operation, thereby providing an envelope to a generated electric tone.

In accordance with the present invention, in a piezoelectric buzzer for outputting sounds such as an alarm sound or tone by applying voltages to both surfaces of a piezoelectric element for a push-pull operation, various advantages may be obtained, such as generating a sound smoothly fading in or out of providing an audience with pleasant sounds as obtained with natural musical instruments by changing with time the voltage levels which are applied to the piezoelectric buzzer.

This invention can be more fully understood from the following detailed description when taken in conjunction with the accompanying drawings, in which:

DETAILED DESCRIPTION

The embodiments of the present invention as applied to an electronic calculator will be described with reference to the accompanying drawings.

Figure 1:
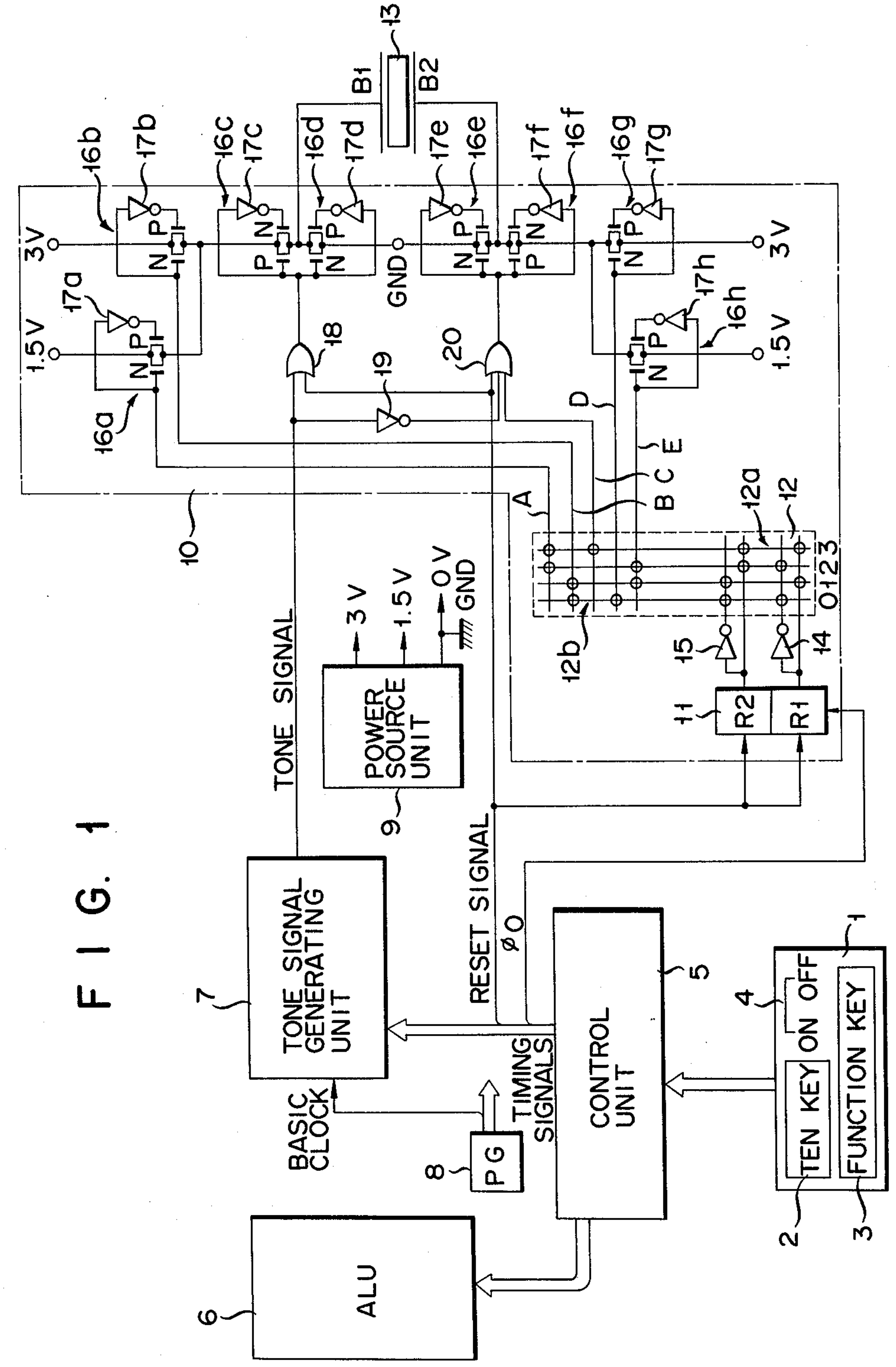
FIG. 1 is a circuit diagram illustrating the overall construction of an envelope control device of a piezoelectric buzzer as applied to an electronic calculator.

Referring to FIG. 1, numeral 1 denotes a key input unit which has various keys such as a ten key 2, a function key 3, and a mode switch 4 for switching from ON mode to OFF mode or vice versa. A key operating signal from the key input unit 1 is supplied to a control unit 5 which supplies a control signal corresponding to the key operation to an ALU (arithmetic and logic unit) 6, a tone signal generating unit 7 and so on. The ALU 6 executes a predetermined arithmetic operation in response to the control signal and then feeds the key input data or the operation result to a display unit (not shown). The tone signal generating unit 7 suitably divides a frequency of a basic clock pulse generated by a PG (pulse generator) 8 for obtaining a tone signal corresponding to the key operated at the key input unit 1 to supply it to a buzzer driving unit 10. The PG 8 also outputs various timing signals for driving the respective circuits shown in FIG. 1. A power source unit 9 outputs, for example, voltages of 3 V, 1.5 V and 0 V (ground level voltage) to the buzzer driving unit 10, and voltages of 3 V and 0 V to other circuits.

The buzzer driving unit 10 comprises a counter 11 of 2 bits, a decoder 12 for decoding the contents of the counter 11, a group of switching elements for selectively applying voltages supplied from the power source unit 9, e.g., 3 V, 1.5 V and 0 V, to both ends B1, B2 of piezoelectric buzzer 13 (comprising an oscillating plate with a piezoelectric element attached thereto) in response to the output from the decoder 12, and so on.

To a respective reset input terminal R of each bit of the counter 11 is supplied from the control unit 5 a reset signal for releasing the sound generating operation of the calculator. The contents of the counter 11 are sequentially incremented in response to a timing signal $\phi$ 0 supplied from the control unit 5 from a time when the depressed condition of the key at the key input unit 1 is released. The counted contents are supplied from the output terminal of each bit of the counter 11 directly to and through an inverter 14 and an inverter 15 to the decoder 12. The decoder 12 comprises an AND circuit part 12*a* for decoding the signal from the counter 11 and an OR circuit part 12*b* for receiving the signal decoded by the AND circuit part 12*a* and outputting it. The decoder 12 feeds drive signals A to E to the group of switching elements according to the contents of the counter 11.

The relation of the contents of the counter 11 and the drive signals A to E outputted by the decoder 12 is shown in Table 1 below:

TABLE 1

| Contents of counter 11 | Decoder 12 A | B | C | D | E |
|---|---|---|---|---|---|
| 0 | L | H | L | H | L |
| 1 | L | H | L | L | H |
| 2 | H | L | L | L | H |
| 3 | H | L | H | L | L |

(In the Table 1 above, "L" stands for Low Level and "H" stands for High Level.)

The group of switching elements comprises combinations of a plurality of transmission gates 16*a* to 16*h* (8 in the case of this embodiment). Each transmission gate 16*a* to 16*h* comprises a pair of switching elements connecting an n-type channel MOS transistor (to be referred to as an n-type transistor hereinafter for brevity) and a p-type channel MOS transistor (to be referred to as a p-type transistor hereinafter for brevity); and inverters 17*a* to 17*h* for inverting the signal supplied to the gate of one of the transistors and supplying it to the other of the transistors.

The drive signal A from the decoder 12 is supplied to the gate electrode of the n-type transistor comprising the first gate 16*a*, as well as to the gate electrode of the p-type transistor through the inverter 17*a*. The first gate 16*a* performs an on-off operation in response to the drive signal A. When the first gate 16*a* is under enabled condition, the selected voltage (1.5 V) supplied from one connection point of the n-type and p-type transistors is outputted from the other connection point to be supplied to one connection point of the transistors of the third gate 16*c*. The drive signal B from the decoder 12 is supplied to the gate electrode of the n-type transistor comprising the second gate 16*b*, as well as to the gate electrode of the p-type transistor through the inverter 17*b*. When the second gate 16*b* is under enabled condition, the selected voltage (3 V) supplied from one connection point of the corresponding transistors is outputted from the other connection point to be supplied to one connection point of the transistors of the third gate 16*c*.

The tone signal outputted by the tone signal generating unit 7 is fed to an OR circuit 18, and an OR circuit 20 through an inverter 19. To these OR circuits 18 and 20 are also fed the reset signal from the control unit 5, and the drive signal C from the decoder 12 is fed to the OR circuit 20. The output signal from the OR circuit 18 is supplied to the gate electrode of the p-type transistor comprising the third gate 16*c*, as well as to the gate electrode of the n-type transistor through the inverter 17*c*. The third gate 16*c*, when it is under enabled condition, applies the selected voltage )1.5 V or 3 V) outputted from the first gate 16*a* or the second gate 16*b* to one end B1 of the piezoelectric buzzer 13. The output signal from the OR circuit 18 is fed to the gate electrode of the n-type transistor comprising the fourth gate 16*d*, as well as to the gate electrode of the p-type transistor through the inverter 17*d*. The fourth gate 16*d* performs an on-off operation in response to the output signal from the OR circuit 18 and, when the gate 16*d* is under the enabled condition, outputs the ground level voltage (0 V) supplied from one connection point of the corresponding transistors as the selected voltage to the one end B1 of the piezoelectric buzzer 13.

The output signal from the OR circuit 20 is fed to the gate electrode of the n-type transistor comprising the fifth gate 16*e*, as well as to the gate electrode of the p-type transistor through the inverter 17*e*. The fifth gate 16*e* performs an on-off operation in response to the output signal from the OR circuit 20. When the gate 16*e* is under the enabled condition, the ground level voltage (0 V) supplied as the selected voltage from one connection point of the corresponding transistors is fed from its other connection point to the other end B2 of the piezoelectric buzzer 20. The output signal from the OR circuit 20 is fed to the gate electrode of the p-type transistor comprising the sixth gate 16*f*, as well as to the gate electrode of n-type transistor through the inverter 17*f*. The sixth gate 16*f* performs an on-off operation in response to the output signal from the OR circuit 20. When it is under enabled condition, the selected voltage (3.0 V) supplied through the seventh gate 16*g* or the selected voltage (1.5 V) supplied through the eighth gate 16*h* to one end of the corresponding transistor pair is applied from its other end to the other end B2 of the piezoelectric buzzer 13. In the seventh gate 16*g*, the drive signal D from the decoder 12 is supplied to the gate electrode of the n-type transistor, as well as to the gate electrode of the p-type transistor through the inverter 17*g*. In the eighth gate 16*h*, the drive signal E from the decoder 12 is supplied to the gate electrode of the n-type transistor, as well as to the gate electrode of the p-type transistor through the inverter 17*h*.

Figure 2:
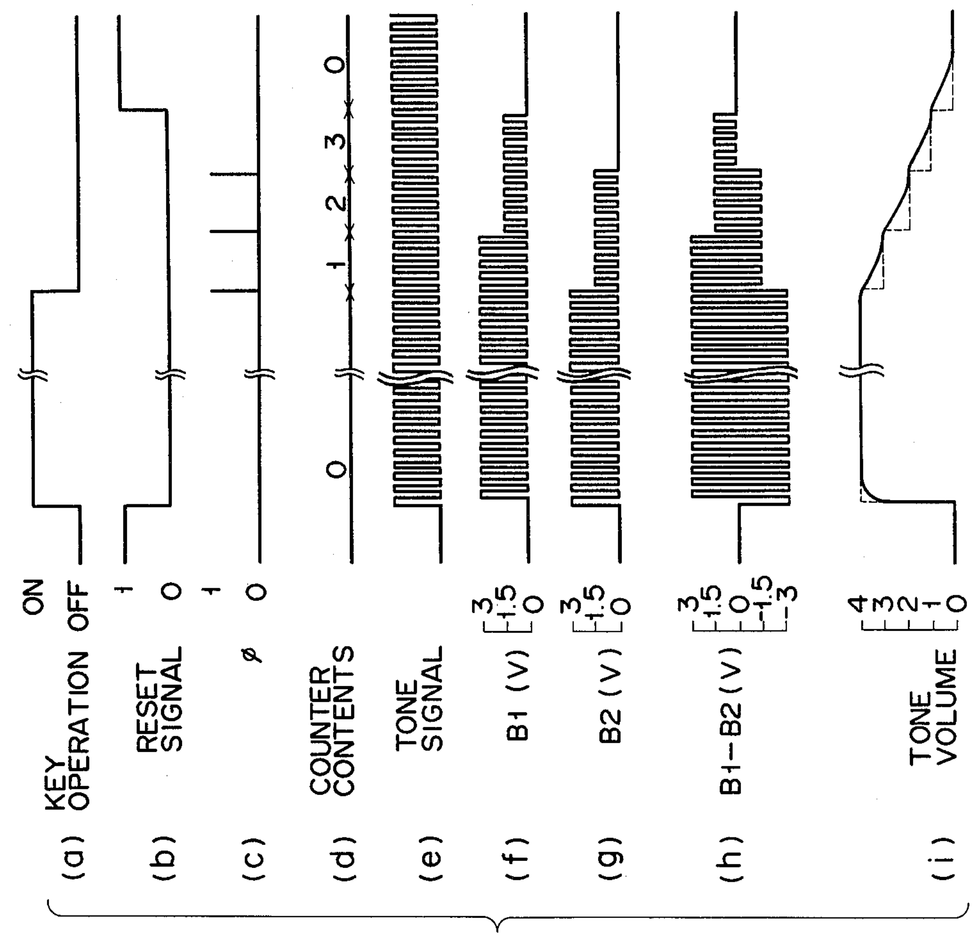
FIGS. 2(*a*) to 2(*i*) are timing charts for explaining the operation of the embodiment of FIG. 1.

The case when an alarm sound is generated by a key operation in an electronic calculator of this construction will be described, referring to the timing charts shown in FIGS. 2(*a*) to 2(*i*). In the key input unit 1, before the key operation is made, when a reset signal as shown in FIG. 2(*b*) is supplied to the OR circuits 18 and 20 from the control unit 5, a high level signal is outputted from the OR circuits 18 and 20. As a result, the third and sixth gates 16*c* and 16*f* are disabled. The supply of the voltage of 1.5 V or 3 V to the piezoelectric buzzer 13 is blocked. On the other hand, the fourth and fifth gates 16*d* and 16*e* are enabled, so that a ground level voltage (0 V) is applied to both ends B1 and B2 of the piezoelectric buzzer 13. Under this condition, the piezoelectric buzzer 13 is not driven. Further, under this condition, the counter 11 has contents of "0" according to the reset signal.

When a key operation is made under the condition that the mode switch 4 of the key input unit 1 is switched to the sound generating mode (ON), the key operating signal as shown in FIG. 2(*a*) is fed to the control unit 5. The control unit 5, in response to this, outputs from the tone signal generating unit 7 a tone signal shown in FIG. 2(*e*) corresponding to the operated key. The control unit 5 also supplies the reset signal to the reset input terminal R of the counter 11 and the input terminals of the OR circuits 18 and 20 as shown in FIG. 2(*b*). Consequently, a signal of the same phase as that of the tone signal is outputted from the OR circuit 18, and a signal inverted by the inverter 19 is outputted from the OR circuit 20. Thus, the third and fourth gates 16*c* and 16*d* alternately repeat the on-off operation in response to the output from the OR circuit 18, and the fifth and sixth gates 16*e* and 16*f* alternately repeat the on-off operation in response to the output from the OR circuit 20. On the other hand, the decoder 12 decodes "0" according to the contents of the counter 11 and makes only the corresponding drive signals B and D high level signals, so that the second and seventh gates 16*b* and 16*g* are constantly kept enabled. Therefore, the voltage applied to the end B1 of the piezoelectric buzzer 13, as shown in FIG. 2(*f*), is the voltage of inverted phase relative to the tone signal (FIG. 2(*e*)) of 3 V or 0 V. To the other end B2 of the piezoelectric buzzer 13 is alternately applied the voltages of 3 V and 0 V of the same phase as that of the tone signal, as shown in FIG. 2(*g*). Consequently, the potential difference between the ends B1 and B2 of the piezoelectric buzzer 13 fluctuates between +3 and −3 V as shown in FIG. 2(*h*), so that the piezoelectric buzzer 13 generates tones corresponding in volume to the amplitude of the potential difference. The volume is assumed to be at level "4" as shown in FIG. 2(*i*) for the sake of explanation.

Under this condition, when the depressed condition of the key at the key input unit 1 is released, timing signals $\phi$ 0 are sequentially outputted as shown in FIG. 2(*c*), In response to each signal $\phi$ 0, the contents of the counter 11 are incremented as shown in FIG. 2(*d*). When the contents of the counter 11 becomes "1", the drive signals B and E corresponding to the counter 11 are made high level signals by the decoder 12, so that the second and eighth gates 16*b* and 16*h* are enabled. The third and fourth gates 16*c* and 16*d* repeat the on-off operation in response to the output signal from the OR circuit 18. Thus, voltages of 3 V and 0 V are alternately applied to the end B1 of the piezoelectric buzzer 13 (see FIG. 2(*f*)). Similarly, the fifth and sixth gates 16*e* and 16*f* repeat the on-off operation in response to the output signal from the OR circuit 20, so that voltages 1.5 V and 0 V are alternately applied to the other end B2 of the piezoelectric buzzer 13 (see FIG. 2(*g*)).

When the timing signal $\phi$ 0 is inputted to the counter 11 under this condition, its contents become "2" as shown in FIG. 2(*d*) so that the drive signals A and E become high level signals by the decoder 12. In response to these drive signals A and E, the first and eighth gates 16*a* and 16*h* are enabled. In response to the output from the OR circuit 18, the third and fourth gates 16*c* and 16*d* perform the on-off operation so that voltages of 1.5 V and 0 V are alternately applied to the end B1 of the piezoelectric buzzer 13 (see FIG. 2(*f*)). In response to the output from the OR circuit 20, the fifth and sixth gates 16*e* and 16*f* perform the on-off operation so that voltage of 1.5 V and 0 V are alternately applied to the other end B2 of the piezoelectric buzzer 13 (see FIG. 2(*g*)).

When the timing signal $\phi$ 0 is inputted to the counter 11, its contents become "3" as shown in FIG. 2(*d*) so that the drive signals A and C alone are made high level signals by the decoder 12. Then the first gate 16*a* is enabled. In response to the on-off operation of the third and fourth gates 16*c* and 16*d*, voltages of 1.5 V and 0 V are alternately applied to the end B1 of the piezoelectric buzzer 13 (see FIG. 2(*f*)). Since a signal corresponding to the drive signal C is outputted from the OR circuit 20, the fifth gate 16*e* is kept enabled while the sixth gate 16*f* is kept disabled. Consequently, 0 V is constantly applied to the other end B2 of the piezoelectric buzzer 13 (see FIG. 2(*g*)).

Since the potential difference between the ends B1 and B2 of the piezoelectric buzzer 13 gradually decreases as shown in FIG. 2(*h*), the volume of the tone signal becomes attenuated, "3", "2" to "1" as shown in FIG. 2(*i*). A parasitic capacitance C is included in the piezoelectric element of the piezoelectric buzzer 13 so that the volume of the tone signal changes in a smooth manner as shown by the solid line in FIG. 2(*i*).

When a certain period of time has elapsed after the sound is generated, the reset signal as shown in FIG. 2(*b*) is outputted so that 0 V is applied to both ends of the piezoelectric buzzer 13 to interrupt the sound generating operation. By this reset signal, the contents of the counter 11 are reset to "0" in preparation for the next key operation.

In the above embodiment, an envelope is provided to the output sound by selecting voltages of 0 V, 1.5 V and 3 V as selected voltages. However, it is also possible to increase or decrease the number of levels of the selected voltages by modification of the counter 11, the decoder 12 and so on.

In the above embodiment, an envelope is produced for obtaining an attenuated sound only when the depressed key is released. However, it is also possible to perform envelope control for making the output sound fade in smoothly when the key is depressed.

Further, in the above embodiment, envelope control is provided to a confirmation sound for the key operation of an electronic calculator. It is also possible to perform envelope control when outputting the single buzzing sound or when programming a predetermined music in advance and outputting it as needed so that the envelope control may be performed with the same construction as described above for generating an electric tone.

Another embodiment of the envelope control device for the piezoelectric buzzer of the present invention will be described for performing envelope control by successively changing with time the voltage level to be applied to the piezoelectric buzzer.

Although a plurality of voltage levels are selected with time for performing the envelope control in the above embodiment, the envelope control is performed by varying with time the resistance values of the resistor components interposed between the piezoelectric buzzer and the power source unit. For the sake of simplicity, the same parts are designated by the same reference numerals as in FIG. 1.

Figure 3:
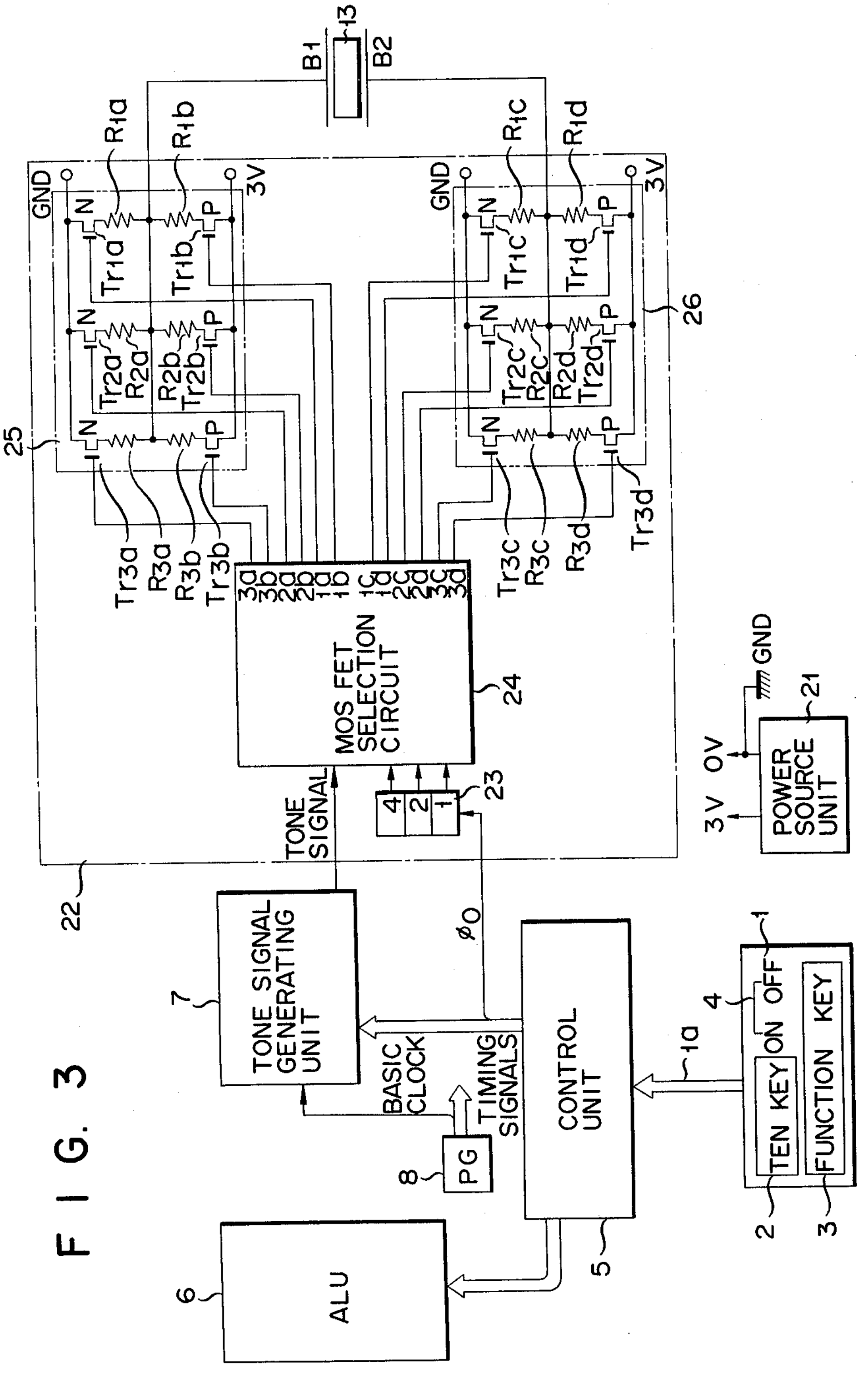
FIG. 3 is a circuit diagram illustrating the overall construction of the device in accordance with another embodiment of the present invention as applied to an electronic calculator.

FIG. 3 is a circuit diagram of this embodiment as applied to an electronic calculator.

A power source unit 21 supplies voltages of, for example, 3 V and 0 V (ground level) to the respective circuits shown in FIG. 3.

A counter 23 of 3 bits is provided with a piezoelectric buzzer 22. This counter 23 counts from "0" to "7" according to the timing signal $\phi$0 from the control unit 5. The contents of the counter 23 are supplied from respective output terminals to an MOSFET selection circuit 24. To this selection circuit 24 is further supplied a tone signal from the tone signal generating unit 7. The tone signal and the data from the counter 23 are decoded, and MOSFET selection signals 1*a* to 1*d*, 2*a* to 2*d*, and 3*a* to 3*d* are outputted.

Among the selection signals, the selection signals 3*a*, 3*b*, 2*a*, 2*b*, 1*a* and 1*b* are supplied to a first resistor circuit 25; selection signals 1*a*, 2*a* and 3*a* are supplied to the gate electrodes of corresponding n-type transistors Tr1*a*, Tr2*a* and Tr3*a*; and the selection signals 1*b*, 2*b* and 3*b* are supplied to the gate electrodes of the corresponding p-type transistors Tr1*b*, Tr2*b* and Tr3*b*. The source electrodes of the respective n-type transistors Tr1*a*, Tr2*a* and Tr3*a* are commonly connected to a ground level voltage (0 V) and their respective drain electrodes are connected in series with the drain electrodes of the corresponding p-type transistors Tr1*b*, Tr2*b* and Tr3*b* through the loads (load MOS) R1*a*, R1*b*; R2*a*, R2*b*; and R3*a*, R3*b*. The source electrodes of the p-type transistors Tr1*b*, Tr2*b* and Tr3*b* are commonly connected to a voltage source of 3 V. One end B1 of the piezoelectric buzzer 13 is connected between the loads R1*a*, R1*b*; R2*a*, R2*b* and R3*a*, R3*b*, and a driving voltage is supplied to it.

The selection signals 1*c*, 1*d*, 2*c*, 2*d*, 3*c* and 3*d* are supplied to a second resistor circuit 26; the selection signals 1*c*, 2*c* and 3*c* are supplied to the gate electrodes of corresponding n-type transistors Tr1*c*, Tr2*c* and Tr3*c*; and the selection signals 1*d*, 2*d* and 3*d* are supplied to the gate electrodes of the corresponding p-type transistors Tr1*d*, Tr2*d* and Tr3*d*. Similarly as in the case of the first resistor circuit 25, the source electrodes of the n-type transistors Tr1*c*, Tr2*c* and Tr3*c* are commonly connected to a ground level voltage, and their respective drain electrodes are connected in series with the drain electrodes of the corresponding p-type transistors Tr1*d*, Tr2*d* and Tr3*d* through the loads (load MOS) R1*c*, R1*d*; R2*c*, R2*d*; and R3*c*, R3*d*. The source electrodes of the p-type transistors Tr1*d*, Tr2*d* and Tr3*d* are commonly connected to a voltage source of 3 V. The other end B2 of the piezoelectric buzzer 13 is connected between the loads R1*c*, R1*d*; R2*c*, R2*d* and R3*c*, R3*d*, and a driving voltage is supplied to it. The resistance of the loads R1*a*, R1*b*, R1*c* and R1*d* is set to be R1 (=4 R0; R0 is constant); the resistance of the loads R2*a*, R2*b*, R2*c* and R2*d* is set to be R2 (=3 R0); and the resistance of the loads R3*a*, R3*b*, R3*c* and R3*d* is set to be R3 (=2 R0), as shown in FIG. 5.

Figures 4, 5:
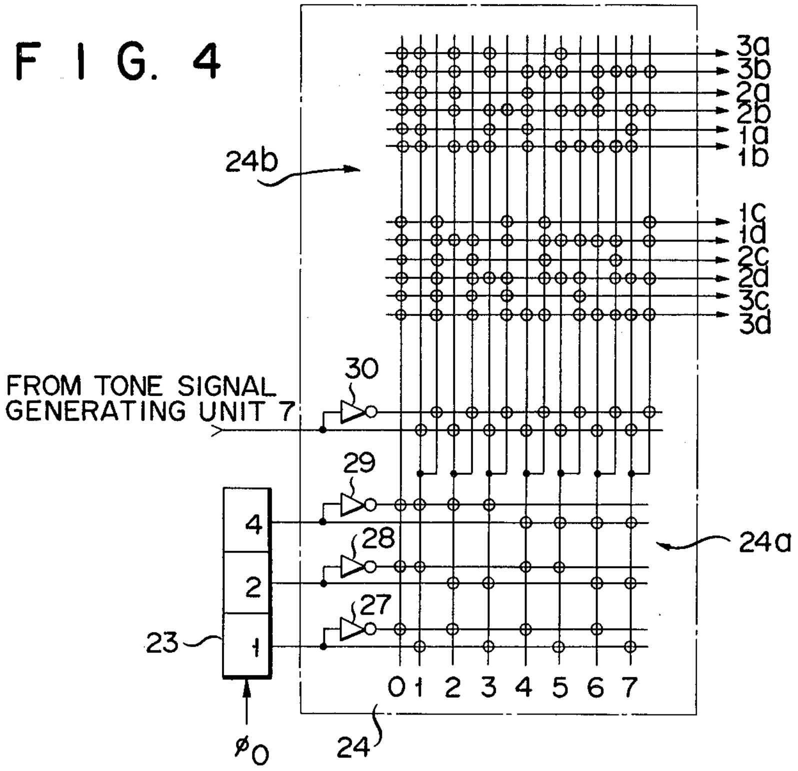
FIG. 4 is a partial view illustrating the details of the MOSFET selection circuit of FIG. 3.
FIG. 5 is a view illustrating the manner in which the resistances change according to the connecting conditions of the first and second resistor circuits in FIG. 3.

FIG. 4 shows the details of the MOSFET selection circuit 24. The selection circuit 24 comprises a decoder which in turn comprises a group of AND circuits 24*a* to which are inputted signals supplied directly or through corresponding inverters 27, 28 and 29 from each bit of the counter 23, and a tone signal supplied from the tone signal generating unit 7 directly or through inverter 30, except when the counted value is "0"; and a group of OR circuits 24*b* which, in response to an output from the group of AND circuits 24*a*, change the selection signals 3*a*, 3*b*, 2*a*, 2*b*, 1*a*, 1*b*, 1*c*, 1*d*, 2*c*, 2*d*, 3*c* and 3*d* from high level into low level signals or vice versa.

The operation for the envelope control for the sound generated according to the key operation in a compact electronic calculator of this construction will be described.

Figure 6A:
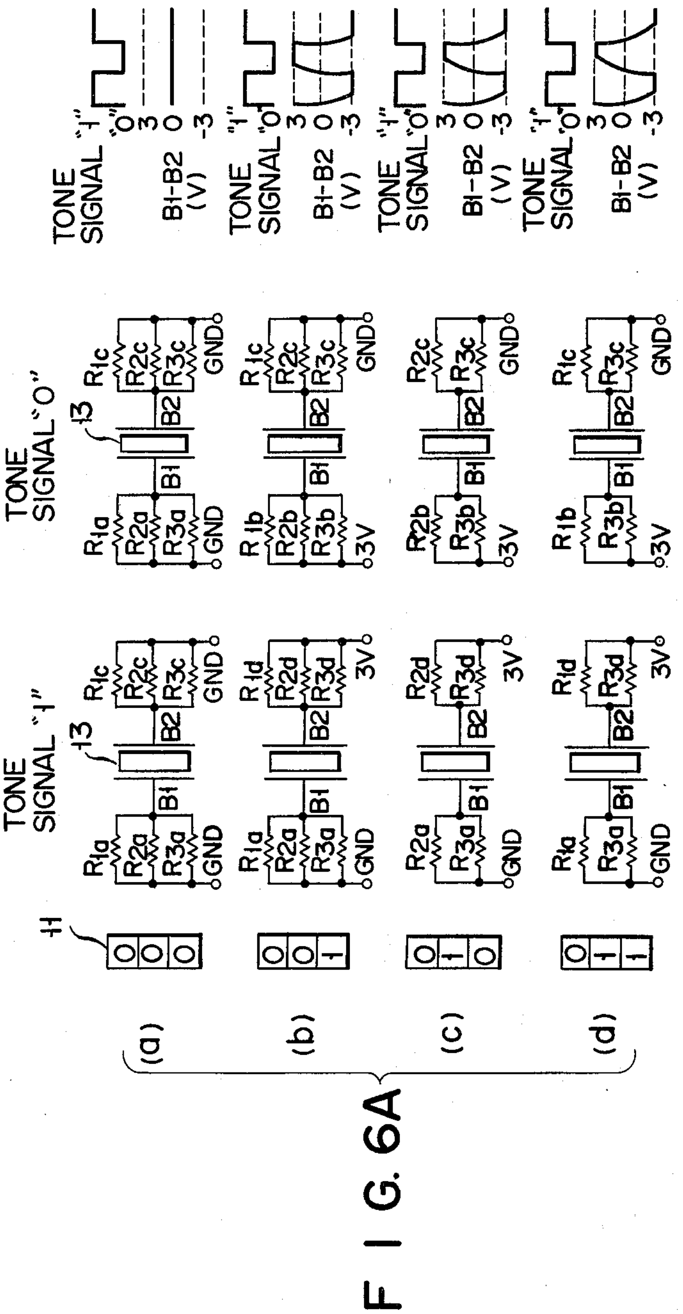
FIGS. 6A and 6B are views illustrating the manner in which the voltage applied to both terminals of the piezoelectric buzzer changes according to the connecting conditions of the loads in FIG. 3.
Figure 6B:
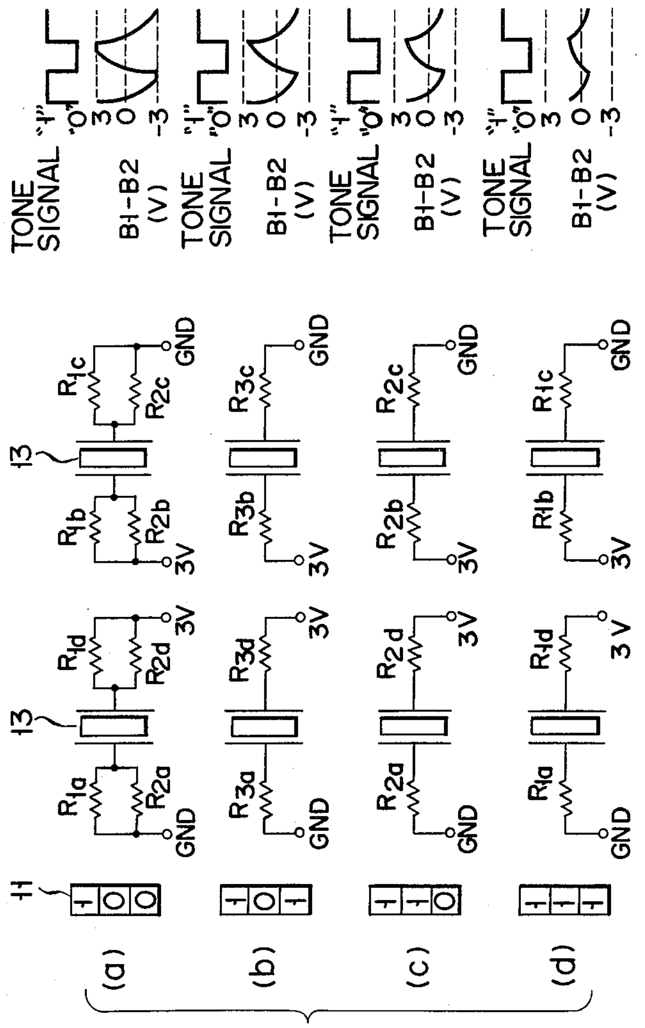
Figure 7:
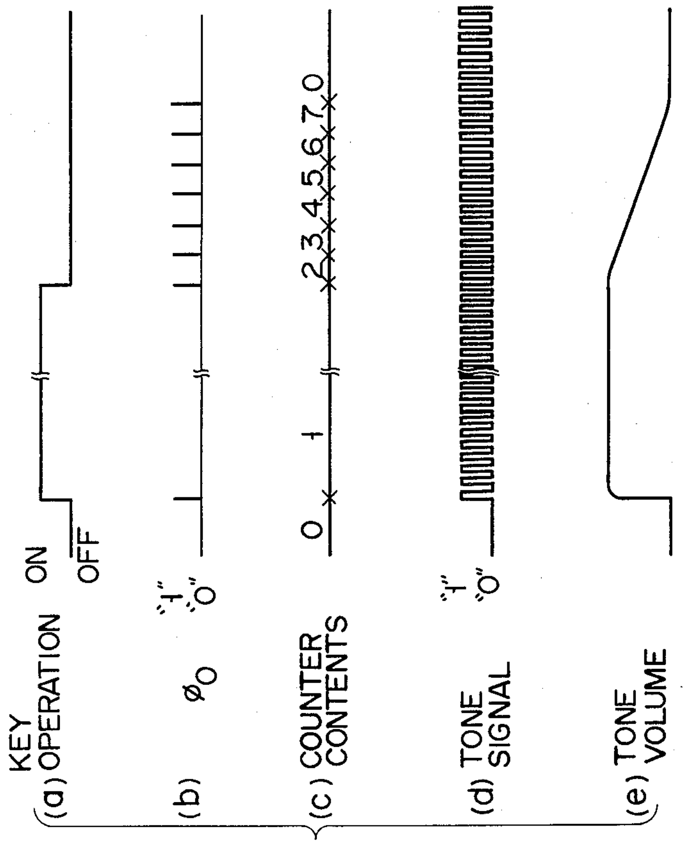
FIG. 7 is a timing chart for explaining the operation of the device shown in FIG. 3.

Before a key operation is performed at the key input unit 1, the contents of the counter 23 are "0" ("000" in binary) as shown in FIG. 7(*c*). Under this condition, all of the selection signals outputted from the selection circuit 24, 1*a* to 1*d*, 2*a* to 2*d* and 3*a* to 3*d*, are of high level regardless of the presence of the tone signal so that, at the first and second resistor circuits 25 and 26, the respective n-type transistors Tr1*a* to Tr3*a*, and Tr1*c* to Tr3*c* are turned on, and the p-type transistors Tr1*b* to Tr3*b* and Tr1*d* to Tr3*d* are turned off. Thus, the connected condition of the loads becomes as the equivalent circuit shown in FIG. 6(*a*), so that the ground level voltages are applied to both ends of the piezoelectric buzzer 13 through the respective parallel three loads R1*a*, R2*a*, R3*a* and R1*c*, R2*c*, R3*c*, thereby generating no sound.

When a key operation is made under the condition that the mode switch 4 of the key input unit 1 turned over to the sound generating mode, the key operation signal as shown in FIG. 7(*a*) is outputted to the control unit 5. Consequently, the control unit 5 drives the tone signal generating unit 7 to output a tone signal of a predetermined frequency corresponding to the operated key as shown in FIG. 7(*d*) and a timing signal $\phi 0$ to make the contents of the counter 23 become "1" ("001" in binary). The selection circuit 24 outputs a selection signal of a predetermined level according to the change in the provided contents of the counter 23 and the level "1" (high level) and "0" (low level) of the tone signal. When the tone signal is of level "1", all of the selection signals 1*a*, 1*b*, ; 2*a* 2*b*, 3*a* and 3*b* provided to the first resistor circuit 25 are of high level, and all of the selection signals 1*c*, 1*d*, 2*c*, 2*d*, 3*c* and 3*d* provided to the second resistor circuit 26 are of low level. When the tone signal is of level "0", the case becomes the just the opposite, so that the all of the selection signals 1*a*, 1*b*, 2*a*, 2*b*, 3*a*, 3*b* provided to the first resistor circuit 25 are of low level, and all of the selection signals 1*c*, 1*d*, 2*c*, 2*d*, 3*c* and 3*d* provided to the second resistor circuit 26 are of high level. Thus, an equivalent circuit as shown in FIG. 6A(*b*) is formed. When the tone signal is "1", the one end B1 of the piezoelectric buzzer 13 is grounded through three loads R1*a*, R2*a* and R3*a* connected in parallel, and a voltage of 3 V is supplied to the other end B2 through three loads R1*d*, R2*d* and R3*d* connected in parallel. When the tone signal is "0", a voltage of 3 V is supplied to the one end B1 of the piezoelectric buzzer 13 through three loads R1*d*, R2*d* and R3*d* connected in parallel, and the other end B2 is grounded through three loads R1*c*, R2*c*, and R3*c* connected in parallel so as to initiate generation of a sound. The resistance of the first and second resistor circuits 25 and 26 becomes substantially 0.9 R0 by the parallel connections of the resistors having resistances R1, R2 and R3 as shown in FIG. 5. Since the piezoelectric buzzer 13 has a parasitic capacitance (C), the voltage waveform of the potential difference [B1–B2 (V)] between the ends B1 and B2 of the piezoelectric buzzer 13 is slightlydistorted, as shown in FIG. 6A(*b*).

When the key is released from the depressed condition at the key input unit 1, timing signal $\phi 0$ are sequentially outputted from the control unit 5 as shown in FIG. 7(*b*). In response to these signals $\phi 0$, the contents of the counter 23 are sequentially incremented as shown in FIG. 7(*c*). When the contents of the counter 23 become "2" ("010" in binary), the transistors Tr1*a* to Tr1*d*, Tr2*a* to Tr2*d*, and Tr3*a* to Tr3*d* are suitably selected to turn on as in the former description, and the first and second resistor circuits 25 and 26 form an equivalent circuit as shown in FIG. 6A(*c*) whose resistance becomes 1.2 R0, as shown in FIG. 5, by the parallel connection of the resistors having the resistances R2 and R3. When the contents of the counter 23 become "3" ("011" in binary), the first and second resistor circuits 25 and 26 form an equivalent circuit as shown in FIG. 6A(*d*) whose resistance becomes substantially 1.3 R0, as shown in FIG. 5, by the parallel connection of the resistors having the resistances R1 and R3. When the contents become "4" ("100" in binary), the first and second circuits 25 and 26 form an equivalent circuit as shown in FIG. 6B(*a*) whose resistance is substantially 1.7 R0, as shown in FIG. 5, by the parallel connection of the resistors having the resistances R1 and R2. Thus, the resistance becomes gradually greater as the contents of the counter are incremented from "2" to "4", so that the voltage waveform of the potential difference [B1–B2 (V)] between the ends B1 and B2 of the piezoelectric buzzer 13 becomes gradually distorted as shown in FIGS. 6A(*c*), 6A(*d*) and 6B(*a*). As the counted contents are further sequentially incremented from "5" to "7", the first and second resistor circuits 25 and 26 form equivalent circuits as shown in FIGS. 6B(*b*) to 6B(*d*). Its resistance becomes gradually greater from R3 or 2R0, R2 or 3R0, to R1 or 4R0, so that the waveform of the potential difference [B1–B2 (V)] applied between the ends B1 and B2 of the piezoelectric buzzer 13 becomes greatly distorted, and the amplitude approaches zero. Thus, the sound generated when the key is released from the depressed condition is made gradually smaller in volume, as shown in FIG. 7(*e*), to provide a desired attenuated sound.

When the contents of the counter 23 reach "7", then the contents become "0" as shown in FIG. 7(*c*) by the timing signal $\phi 0$, and the first and second resistor circuits 25 and 26 return to the original condition (before the key operation is effected), that is, to the condition shown in FIG. 6A(*a*) for the next key operation.

Although the volume level is divided into 8 stages in the above embodiment to obtain an attenuated sound, the present invention is not limited to this. For example, the number of volume levels may be increased or decreased for obtaining smoothly attenuated sounds. In this case, the number of loads and the resistances of the first and second resistor circuits 25 and 26 may be variously modified.

Although the MOSFET selection circuit 24 comprises a decoder in the above embodiments, it may also comprise a gate circuit.

Further, although the envelope control is performed only when the key is released from the depressed condition, other envelope controls such as an envelope control for gradually fading in the sound when the key is depressed are also possible.

In the above embodiment, an envelope control is performed on the confirmation sound of the key operation of an electronic calculator. However, the present invention is not limited to this, but envelope control may be performed with the same construction as described above for generating an electronic sound by microprogramming a single buzzing sound or a predetermined music for outputting it as needed.

What is claimed is:

1. An envelope control device for a piezoelectric buzzer comprising:

a sound generator having two surfaces, and comprising an oscillating plate with a piezoelectric element attached thereto;

a power source for supplying voltages to be applied to both surfaces of said sound generator;

tone signal generating means for generating a tone signal for generating an electric tone; and envelope control means for changing with time voltages to be applied to said both surfaces of said sound generator for supplying said changing voltages to said sound generator for push-pull operation, thereby providing an envelope to a generated electric tone.

2. An envelope control device for a piezoelectric buzzer according to claim 1 wherein said power source supplies voltages of not less than 2 levels and said envelope control means provides an envelope by successively selecting voltages of not less than 2 levels outputted from said power source.

3. An envelope control device for a piezoelectric buzzer according to claim 2 wherein said envelope control means includes counting means for sequentially counting up or down when the input of a tone signal outputted from said tone signal generating means initiates or when the input to said envelope control means terminates;

decoding means for reading the contents of said counting means; and a plurality of gate means disposed for each of said voltages of not less than 2 levels;

said decoding means reading the contents of said counting means, performing an on-off control of said gate means according to the contents thus read, and successively changing the voltages to be applied to said both surfaces of said sound generator.

4. An envelope control device for a piezoelectric buzzer according to claim 3 wherein said gate means comprises a transmission gate and an inverter.

5. An envelope control device for a piezoelectric buzzer according to claim 1 wherein said power source outputs voltages of 2 levels and said envelope control means includes a group of resistors for dividing voltages between said 2 levels into a plurality of levels, and selection means for successively selecting voltages divided into a plurality of levels by said resitor group.

6. An envelope control device for a piezoelectric buzzer according to claim 5 wherein said selecting means includes counting means for sequentially counting up or down when the input of a tone signal outputted from said tone signal generating means to said envelope control means initiates or when the input to said envelope control means terminates;

decoder means for reading the contents of said counting means; and a plurality of gate means disposed for each resistor in said resistor group;

said gate means performing on-off operations according to the contents read out by said decoding means for successively changing the voltages to be applied to said both surfaces of said sound generator.

* * * * *